United States Patent [19]
Danstrom et al.

[11] Patent Number: 5,990,753
[45] Date of Patent: Nov. 23, 1999

[54] PRECISION OSCILLATOR CIRCUIT HAVING A CONTROLLABLE DUTY CYCLE AND RELATED METHODS

[75] Inventors: Eric J. Danstrom, Palatine, Ill.; John Buchanan, Colorado Springs, Colo.

[73] Assignee: STMicroelectronics, Inc., Carrollton, Tex.

[21] Appl. No.: 08/862,946

[22] Filed: May 30, 1997

Related U.S. Application Data

[63] Continuation-in-part of application No. 08/592,922, Jan. 29, 1996, Pat. No. 5,638,031.

[51] Int. Cl.$^6$ .............................. H03B 5/24; H03K 3/02; H03K 3/3565; G01P 3/50
[52] U.S. Cl. ..................... 331/143; 331/111; 331/177 R; 327/175; 324/160; 324/166
[58] Field of Search ............................. 331/34, 111, 143, 331/177 R; 332/109–113; 327/175; 375/238; 73/488, 507; 324/160–180

[56] References Cited

U.S. PATENT DOCUMENTS

| | | | |
|---|---|---|---|
| 4,167,699 | 9/1979 | Baker | 324/171 |
| 4,365,212 | 12/1982 | Gentile et al. | 331/111 |
| 4,594,565 | 6/1986 | Barreras | 331/108 |
| 4,723,114 | 2/1988 | D'Arrigo et al. | 331/111 |
| 4,742,315 | 5/1988 | Schreilechner | 331/108 |
| 4,904,960 | 2/1990 | Izadinia et al. | 331/111 |
| 4,983,931 | 1/1991 | Nakano | 331/111 |
| 5,070,311 | 12/1991 | Nicolai | 331/111 |
| 5,250,914 | 10/1993 | Kondo | 331/111 |
| 5,341,113 | 8/1994 | Baron et al. | 331/144 |
| 5,459,437 | 10/1995 | Campbell | 331/111 |
| 5,508,664 | 4/1996 | Rizzo | 331/111 |
| 5,614,871 | 3/1997 | Miyabe | 331/111 |
| 5,638,031 | 6/1997 | Danstrom | 331/111 |
| 5,740,083 | 4/1998 | Anderson et al. | 364/565 |
| 5,742,198 | 4/1998 | Horie et al. | 327/551 |
| 5,757,676 | 5/1998 | Hobelsberger | 364/565 |
| 5,821,745 | 10/1998 | Makino et al. | 324/207.25 |

FOREIGN PATENT DOCUMENTS

| | | | |
|---|---|---|---|
| 0 231 872 | 8/1987 | European Pat. Off. | H02M 3/155 |
| 43 06 950 A1 | 8/1994 | Germany . | |
| 43 40 924 A1 | 8/1995 | Germany . | |
| 59-165516 | 9/1984 | Japan | H03K 3/03 |

OTHER PUBLICATIONS

Gregorian et al., Switched–Capacitor Circuit Design, Aug. 1983, Prodceedings of the IEEE, vol. 71, No. 8, Aug. 1983, pp. 180–205.

"Variable Freqeucny Oscillator for Switching Regulator Control," IBM Technical Disclosure Bulletin, vol. 19, No. 12, May 1977, pp. 4652–4653.

U.S. Patent Application Ser. No. 08/623,613.

Stephen Hobrecht, "An Inteliligent BiCMOS/DMOS Quad 1–A High–Side Switch," Dec. 6, 1990, pp. 1395–1402 *IEEE Journal of Solid State Circuits* vol. 25No. 6.

*Primary Examiner*—David Mis
*Attorney, Agent, or Firm*—Theodore E. Galanthay; Lisa K. Jorgenson; Christopher F. Regan

[57] ABSTRACT

A precision oscillator includes a capacitor, a charging current source, a discharging current source, a switch for alternatingly connecting the capacitor to the charging current source and the discharging current source, and a hysteretic comparator connected to the capacitor for producing an oscillating signal responsive to charging and discharging the capacitor. The oscillator may also preferably include a duty cycle controller connected to at least one of the charging current source and the discharging current source for setting the charging current and/or the discharging current to thereby set a duty cycle of the oscillating signal by setting a ratio of the charging and discharging currents. The charging current source may have a current setting input for permitting setting of a charging current to the capacitor, and the discharging current source may have a current setting input for permitting setting of a discharging current from the capacitor. The current setting inputs are connected to the duty cycle controller which, in one embodiment, may be provided by a processor and respective digital-to-analog converters.

16 Claims, 5 Drawing Sheets

PRECISION OSCILLATOR CIRCUIT HAVING A CONTROLLABLE DUTY CYCLE AND RELATED METHODS

RELATED APPLICATION

The present application is a continuation-in-part application of U.S. patent application Ser. No. 08/592,922 filed Jan. 29, 1996, now U.S. Pat. No. 5,638,031.

FIELD OF THE INVENTION

This invention relates to electronic oscillator circuits used to generate digital clock signals, and, more specifically, to precision oscillator circuits.

BACKGROUND OF THE INVENTION

The problem addressed by this invention is encountered in oscillator circuits used for generating precision clock signals. Precision clock signals are widely used in digital circuits to synchronize the activities of one digital circuit to the rest of the circuits in the system. A digital system may include one or more microprocessors, bus controllers, peripheral controllers, memory, and peripherals, such as disk drives, all of which may typically be synchronized from one system clock. A less complex system may include a single microcontroller with at least one input device, such as a sensor, and at least one output device, such as an ignition controller. And yet a less complex system may include an oscillator to provide a frequency reference for the speedometer or tachometer of an automobile. It will be appreciated that precision oscillators are used in a full range of simple to complex systems.

Referring now to FIG. 1, a precision oscillator 24 according to the prior art is shown. The oscillation cycle begins by setting and resetting RS flip-flop 20. The flip-flop 20 is set by the current source 2 charging the capacitor 4. As the capacitor 4 is charged, the voltage on the non-inverting input of the comparator 8 rises. When this voltage exceeds the voltage, Vcalib, on the inverting input, the output of comparator 8 will rise to the positive voltage rail of the comparator thereby setting the output of the flip-flop 20 to a digital "1" voltage. This subsequently turns off the current source 2, turns on the transistor 6, turns off the transistor 14 (which was on), and turns on the second current source 10. Consequently, the second capacitor 12 is charged by the second current source 10 and the voltage on the non-invert input of the second comparator 16 rises. When the voltage on the non-inverting input of the second comparator 16 exceeds the voltage on the inverting input, the output of the comparator will swing to the positive voltage rail thereby resetting the output of the flip-flop 20 to a digital "0". The resetting of the flip-flop 20 subsequently turns on the first current source 2, turns transistor 6 off, transistor 14 on, and turns the second current source 10 off, thereby restarting the oscillation cycle.

Although the illustrated prior art circuit 24 does not require a precision crystal, it is still relatively complicated in that the circuit requires two capacitors 4 and 12, two comparators 8 and 16, and an RS flip-flop 20. In addition, precise calibration for a duty cycle of the oscillator may be difficult to achieve.

SUMMARY OF THE INVENTION

It is therefore an object of the invention to provide a precision oscillator which does not require a precision crystal and which has reduced circuit complexity.

It is another object of the invention to provide a precision oscillator which oscillates at a frequency independent of the supply voltage and which has a duty cycle which may be readily and precisely set.

These and other objects, features and advantages in accordance with the present invention are provided by a precision oscillator including a capacitor, a charging current source, a discharging current source, switch means for alternatingly connecting the capacitor to the charging current source and the discharging current source, and a hysteretic comparator connected to the capacitor for producing an oscillating signal responsive to charging and discharging the capacitor. The oscillator may also preferably include duty cycle control means connected to at least one of the charging current source and the discharging current source for setting the charging current and/or the discharging current to thereby set a duty cycle of the oscillating signal.

The charging current source may have a current setting input for permitting setting of a charging current to the capacitor, and the discharging current source may have a current setting input for permitting setting of a discharging current from the capacitor. The duty cycle control means preferably comprises means for setting a ratio of the charging current and the discharging current to thereby set the duty cycle of the oscillating signal. The current setting inputs are preferably connected to the duty cycle control means which, in one embodiment, may be provided by a processor and respective digital-to-analog converters.

The charging current source is preferably connected to a first supply voltage, and the capacitor is preferably connected to a second supply voltage so that the charging current source is connectable in series with the capacitor between the first and second supply voltages. In addition, the discharging current source is preferably connected to the second supply voltage so that the discharging current source is connectable in parallel with the capacitor.

The oscillator may include switch control means for operating the switch means based upon the oscillating signal from the hysteretic comparator. For example, the switch control means may include a feedback path from the output of the hysteretic comparator or may be a feedback path from at least one inverter connected downstream from the hysteretic comparator.

The charging current source may also have an enable input for enabling operation thereof, and the discharging current source may also have an enable input. The switch control means may further comprise enabling means connected to the respective enable inputs of the charging current source and discharging current source for alternatingly enabling same. The enabling means may be provided by respective feedback paths from the hysteretic comparator and an inverter connected to the comparator.

One aspect of the present invention is that the precision oscillator with the controllable duty cycle may be used in an electronic circuit comprising including a circuit portion using the oscillating signal from the oscillator. For example, the electronic circuit may further comprise a wheel sensor and an air core gauge motor. The circuit portion using the oscillating signal preferably comprises an analog voltage converter connected between the wheel sensor and the air core gauge motor so that the electronic circuit defines a speedometer system.

A method aspect of the present invention is for generating an oscillating signal using a capacitor, a charging current source and a discharging current source. The method preferably comprises the steps of: alternatingly connecting the capacitor to the charging current source and the discharging current source to thereby alternatingly charge and discharge the capacitor; and hysteretically comparing a capacitor voltage to a reference voltage for producing an oscillating signal responsive to charging and discharging the capacitor. The method may further preferably include the step of setting at least one of the charging current and the discharging current to thereby set a duty cycle of the oscillating signal.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 2:
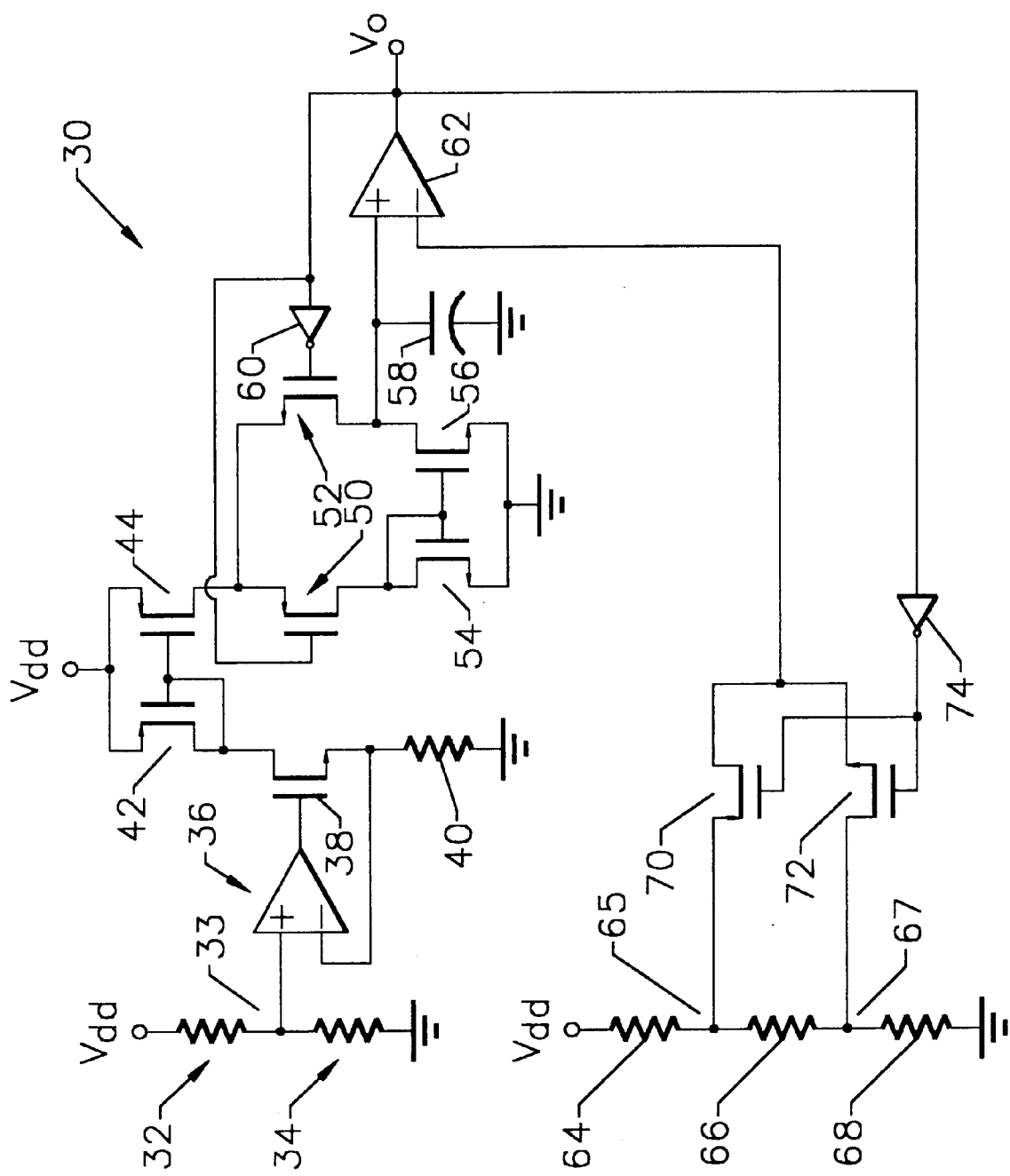
FIG. 2 is a schematic diagram of a first embodiment of a precision oscillator in accordance with the present invention.

A precision oscillator 30 in FIG. 2 is constructed with a reference current generator, a charge control stage, a capacitor, a comparator, and a voltage threshold generator. The reference current generator is constructed using resistors 32, 34, and 40, amplifier 36, N-channel transistor 38, and P-channel transistors 42 and 44. More specifically, the first terminal of resistor 32 is connected to a voltage source Vdd and the second terminal of resistor 32 is connected to the noninverting input of amplifier 36 and the first terminal of resistor 34. The second terminal of resistor 34 is connected to ground. The output of amplifier 36 is connected to the gate of transistor 38. The source of transistor 38 is connected to the inverting input of amplifier 36 and to the first terminal of resistor 40, the second terminal of resistor 40 is connected to ground. This configuration is commonly referred to as a voltage-follower since transistor 38 will be driven by amplifier 36 so that the voltage on resistor 40 follows the voltage on noninverting input of comparator 36.

The drain of transistor 38 is connected to a current mirror made from transistors 42 and 44. The drain of transistor 38 is connected to the drain and gate of transistor 42 and the gate of transistor 44. The sources of transistors 42 and 44 are connected to Vdd. The drain of transistor 44 is the mirrored current output of the current mirror and is also the output of the reference current generator.

The charge control stage is constructed using P-channel transistors 50 and 52, N-channel transistors 54 and 56, and inverter 60. The sources of transistors 50 and 52 are coupled together to form the input of the charge control stage and are therefore, coupled to the output of the reference current generator. The gate of transistor 50 is connected to the input of inverter 60. The output of inverter 60 is connected to the gate of transistor 52. The drain of transistor 50 is connected to the drain and gate of transistor 54 and to the gate of transistor 56. The sources of transistors 54 and 56 are connected to ground. The drains of transistors 52 and 56 are connected together to form the output of the charge control stage. This output is connected to a first terminal of capacitor 58 and the inverting input of comparator 62.

The noninverting input of comparator 62 is connected to the output of the voltage threshold generator. The output of the comparator is the output of the oscillator and is connected to the input of inverter 60, the gate of transistor 50, and the gates of transistors 70 and 72.

The voltage threshold generator is constructed by connecting three resistors 64, 66 and 68 in series across the supply voltage. These three resistors can be of equal value such that node 65, between resistor 64 and 66, has a voltage of approximately ⅔ the supply voltage. Similarly, the voltage at node 67, between resistors 66 and 68, has a voltage of approximately ⅓ the supply voltage. Alternate methods for generating two reference voltages will be known by persons skilled in the art. The source of transistor 70 is connected to node 65. The source of transistor 72 is connected to node 67. The gates of transistors 70 and 72 are connected to the output of inverter 74. The input of inverter is connected to the output of comparator 62. The drain of transistor 70 and the source of transistor 72 are connected together and to the noninverting input of comparator 62.

In operation, the reference current generator generates a reference current which is equal a function of the voltage at node 33, the resistance of resistor 40, and the ratio of transistors 42 and 44. Since amplifier 36 is configured as a voltage follower, the voltage on the noninverting input of amplifier 36 will be maintained across resistor 40. Thus, the current through resistor 40 is:

$$I_{40} = \frac{V_{33}}{R40}$$

$V_{33}$ is established by selecting resistors 32 and 34 to generate the desired voltage reference as is well known in the art. $I_{40}$ is then mirrored by the current mirror constructed with transistors 42 and 44. Therefore, the reference current is the current at the drain of transistor 44 and can be adjusted by adjusting variables in the above equation as well as the ratio of area between transistors 42 and 44, as will be discussed later in this specification.

The charge control stage is used to direct the reference current generated from the reference current generator either to capacitor 58 or to remove the reference current from the capacitor. More specifically, when the output of comparator 62 is high, transistor 50 is turned off and transistor 52 is turned on. Therefore, the reference current from the reference current generator is conducted through transistor 52 onto capacitor 58. Conversely, when the output of comparator 62 is low, transistor 50 is on and transistor 52 is turned off. Therefore, the reference current from the reference current generator is conducted through transistor 50 and therefore, through the current mirror made from transistors 54 and 56. If the ratio between transistors 54 and 56 is approximately equal to one, a current approximately equal to the reference current will be discharged from capacitor 58. In short, the charge control stage either charges capacitor 58 or discharges capacitor 58 responsive to the output of comparator 62.

The voltage threshold generator couples either the voltage at node 65 or the voltage at node 67 to the noninverting input of comparator 62. When the output of comparator 62 is high, the output of the inverter 74 is low so that transistor 70 is on and transistor 72 is turned off so that the voltage at node 65 is coupled to the noninverting input of comparator 62. Conversely, the voltage at node 67 is coupled to the noninverting input of comparator 62 when the output of comparator 62 is at a low voltage level which drives the output of inverter 74 high.

Figure 4:
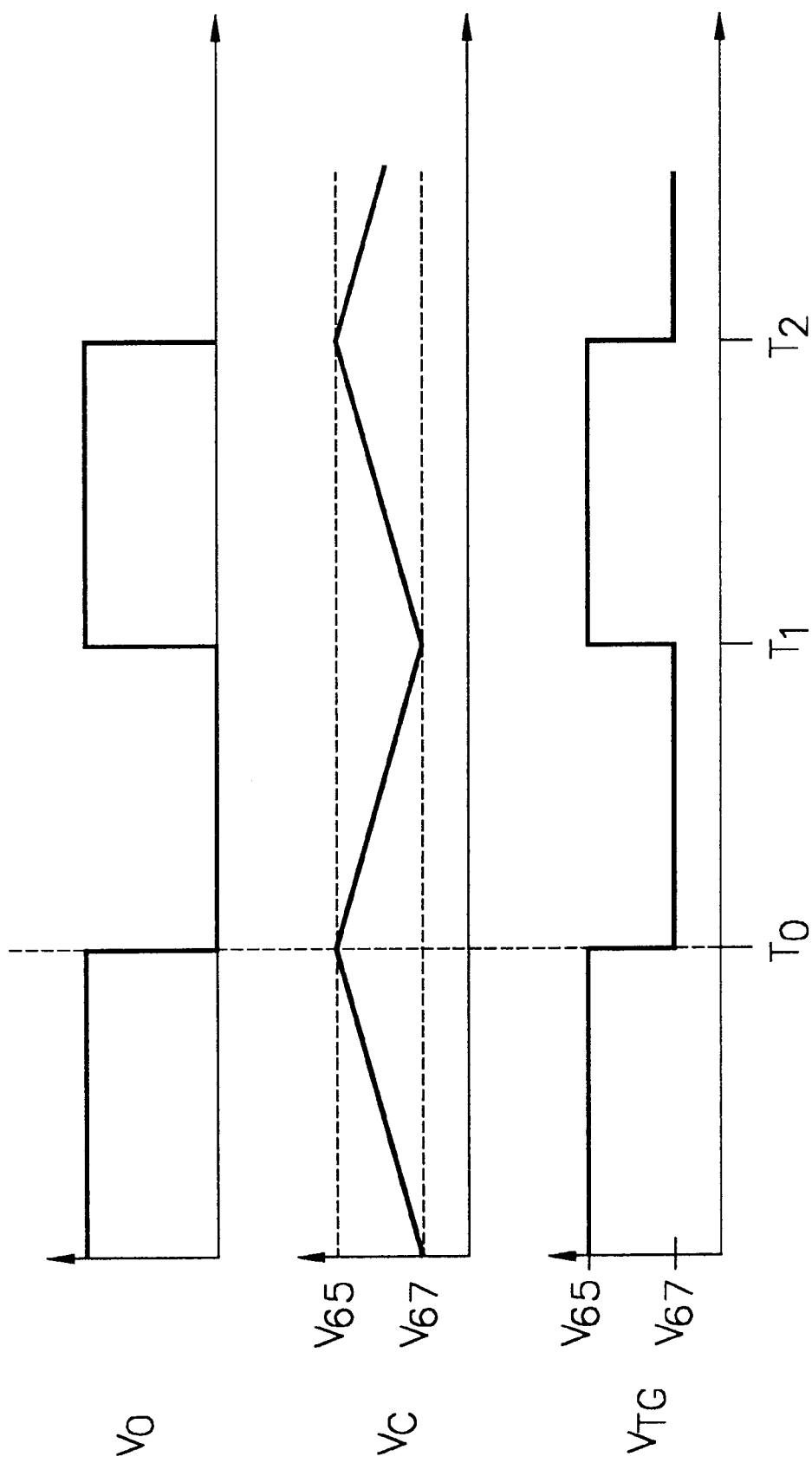
FIG. 4 is a timing diagram of various signals produced by the precision oscillator as shown in FIG. 1.

As shown in FIG. 4, an oscillation cycle begins at $T_0$ when the output of comparator 62, Vo is at a low voltage level. In this state, the charge control stage is discharging capacitor 58 at a rate proportional to the reference current and inversely proportional to the size of the capacitor. The voltage on the capacitor, Vc, is discharging at a constant rate. The noninverting input of comparator 62 is coupled to the voltage, V67 at node 67. When the voltage on capacitor 58 falls below the voltage on the noninverting input of comparator 62 the comparator 62 switches to a high voltage state, as shown at $T_1$. Consequently, the charge control stage begins to charge capacitor 58 and the voltage threshold generator changes the voltage threshold to the voltage at node 65. When the voltage on capacitor 58 exceeds the voltage on node 65 comparator 62 will again change states such that the output is now again at a low voltage and the oscillation cycle will restart, as shown at $T_2$. The frequency of oscillation is controlled by controlling reference current and the capacitance of C58.

By using the disclosed precision oscillator only one capacitor 58 is required, as compared to two capacitors in the prior art. Additionally, only one comparator 62 is required, compared to the two comparators required in the prior art. FIG. 2 shows transistor 44 as the mirrored current stage of a current mirror in the reference current generator.

Figure 1:
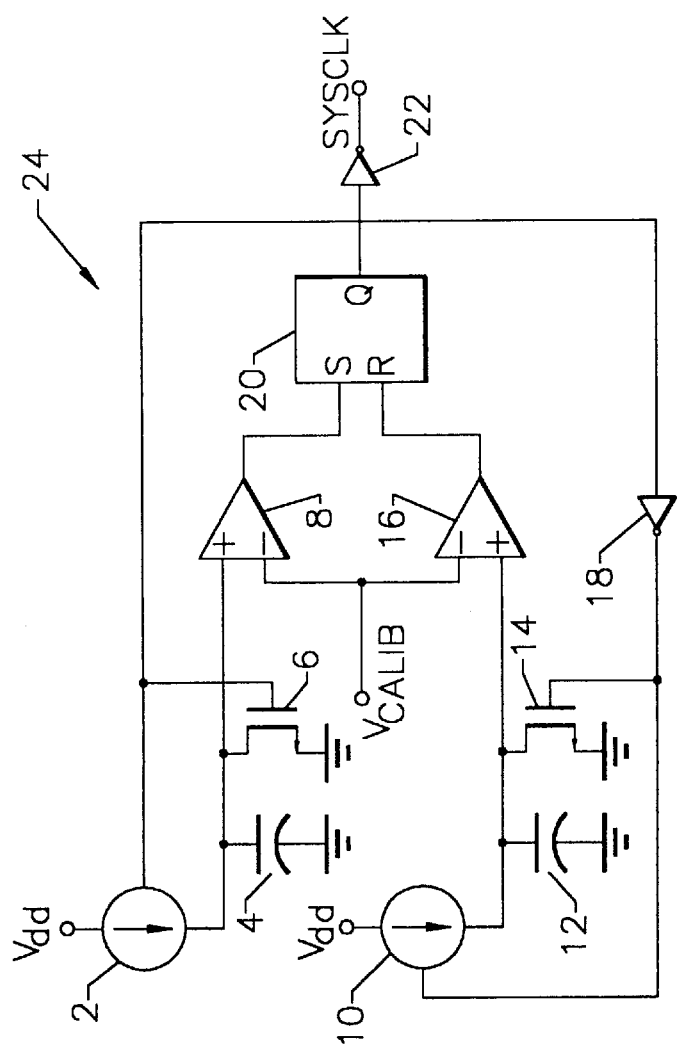
FIG. 1 is a schematic diagram of a precision oscillator as known in the prior art.
Figure 3:
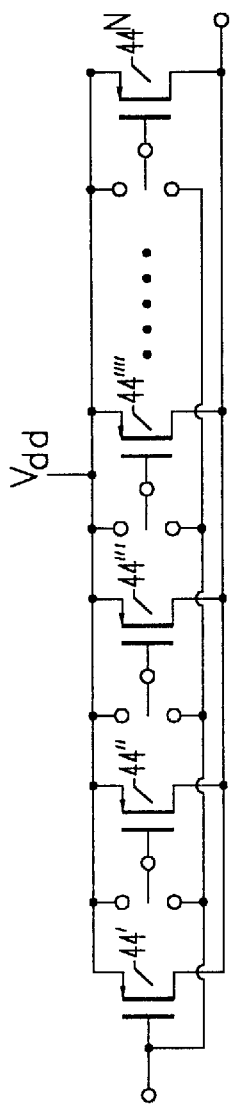
FIG. 3 is a schematic circuit diagram of an alternate embodiment of a portion of the precision oscillator shown in FIG. 2.

FIG. 3 shows that transistor 44 of FIG. 2 can be a series of transistors coupled in parallel. More specifically, FIG. 3 shows the source of transistors 44', 44'', 44''', 44'''', and 44$^n$ all connect to the source voltage Vdd. Similarly, the drains of transistors 44', 44'', 44''', 44'''', and 44$^n$ are all connected together and form the output of the current mirror. The gate of transistor 44' would be connected to the gate and drain of transistor 42 of FIG. 2. Additionally, the gate of transistors 44' through 44$^n$ can either be connect to Vdd or to the gate of transistor 44'. Thus, it would be possible to trim the current of the reference current generator in either the manufacturing process or the design process of the precision oscillator. Consequently, this circuit also provides the benefit of providing a precision oscillator which oscillates as a function of current (the reference current) instead of as a function of the supply voltage.

Figure 5:
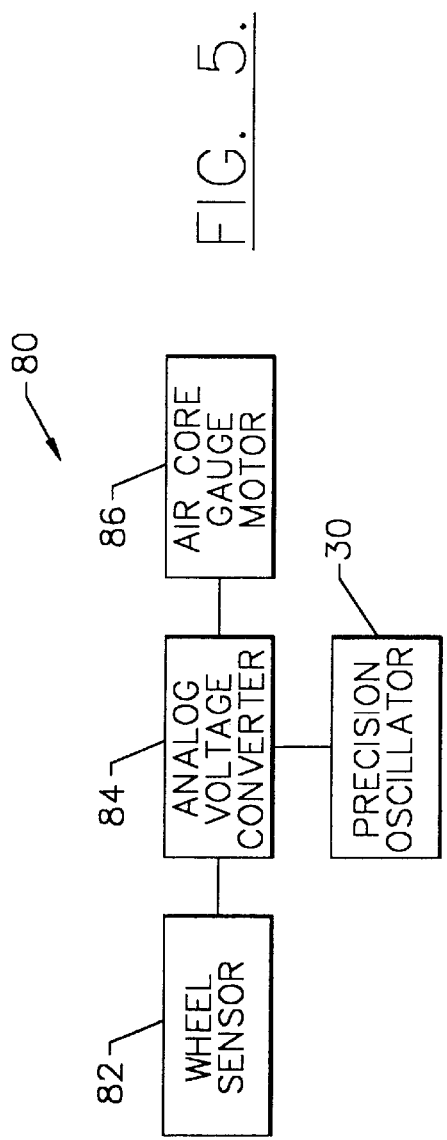
FIG. 5 is schematic block diagram of speedometer system which includes the precision oscillator in accordance with the present invention.

FIG. 5 illustrates a speedometer system 80 which uses the precision oscillator 30. More specifically, this figure shows a wheel sensor 82 coupled to an analog voltage converter 84. The analog voltage converter 84 and precision oscillator are combined to drive the air core gauge motor 86, which drives the speedometer display as is known in the art.

Figure 6:
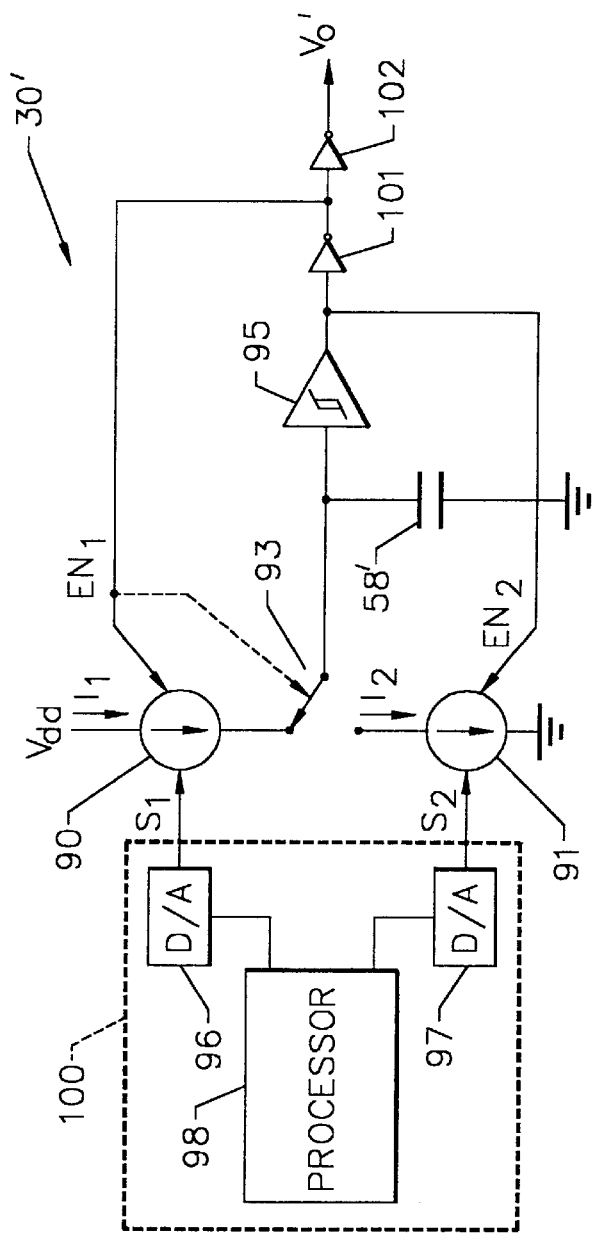
FIG. 6 is a schematic block diagram of a second embodiment of the precision oscillator circuit in accordance with the invention.
Figure 7:
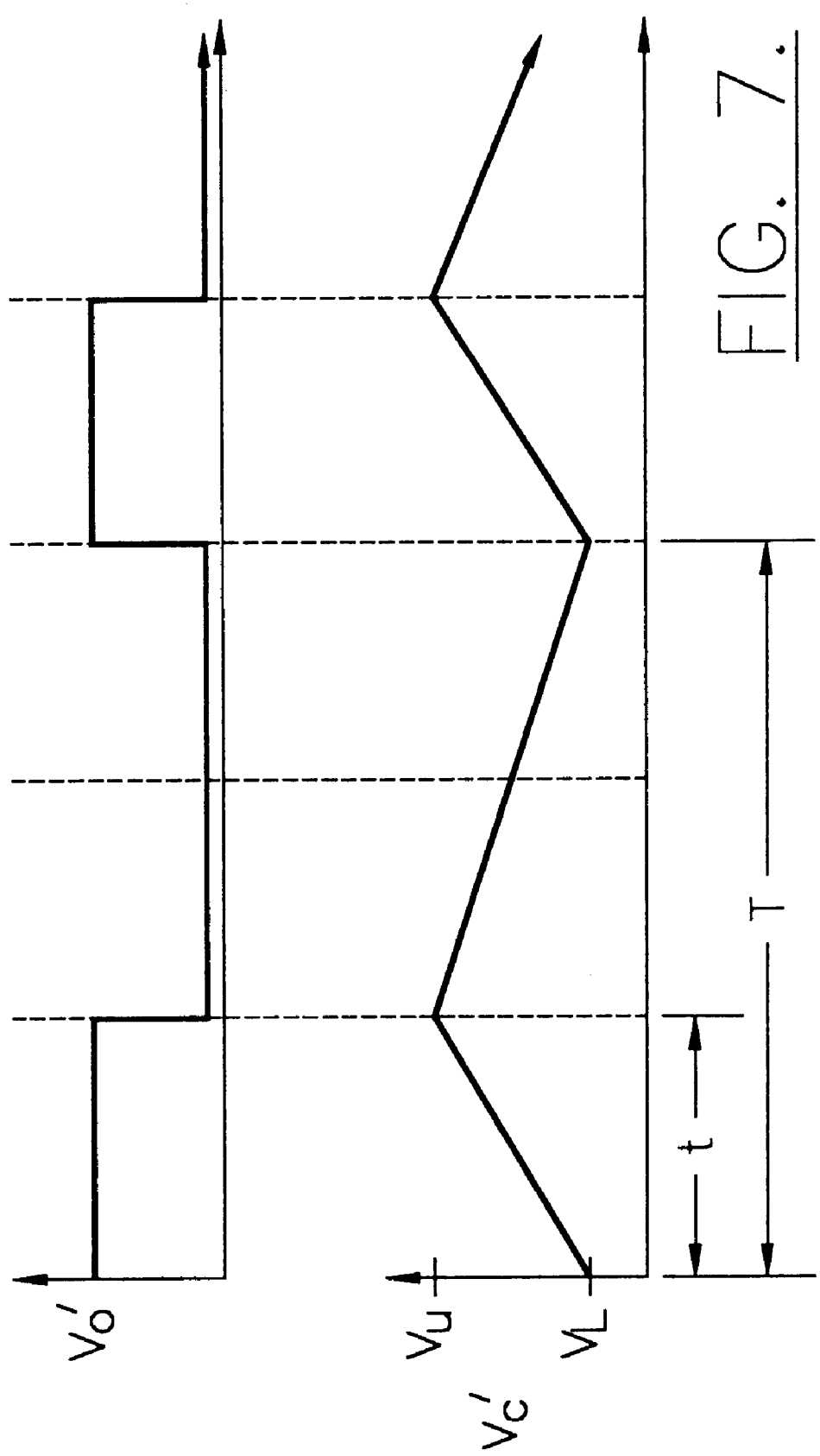
FIG. 7 is a timing diagram of various signals produced by the precision oscillator as shown in FIG. 6.

Turning now additionally to FIGS. 6 and 7 another embodiment of the precision oscillator 30' is now described. The oscillator 30' illustratively includes a single capacitor 58', a first or charging current source 90, and a second or discharging current source 91. The oscillator also includes a switch 93 for alternatingly switching the capacitor 58' to the charging current source 90 and then the discharging current source 91. Accordingly, the switch 93 functions to alternatingly charge and discharge the capacitor 58'.

In other words, the charging current source 90 is illustratively connected to a first supply voltage $V_{dd}$, and the capacitor 58' is connected to a second supply voltage (ground) so that the charging current source is connectable in series with the capacitor between the first and second supply voltages by operation of the switch 93. In addition, the discharging current source 91 is connected to the second supply voltage (ground) so that the discharge current source is connectable in parallel with the capacitor by the switch 93.

The charging current source 90 is preferably of a type having a current setting input for permitting setting of a charging current $I_1$ to the capacitor 58' as would be readily understood by those skilled in the art. In addition, the discharging current source 91 also preferably has a current setting input for permitting setting of a discharging current $I_2$ from the capacitor.

A hysteretic comparator 95 is connected to the capacitor 58' for producing an oscillating signal responsive to alternatingly charging and discharging a voltage of the capacitor. The hysteretic comparator 95 will switch logic states at the upper and lower boundaries of the hysteresis band as will be readily understood by those skilled in the art. The further operation and construction of the hysteretic comparator 95 will be readily appreciated by those skilled in the art without further description herein.

The oscillator 30' also preferably includes duty cycle control means 100 connected to the respective current setting inputs of the charging current source 90 and the discharging current source 91 for setting the respective charging current and the discharging current to thereby set a duty cycle of the oscillating signal from the hysteretic comparator 95. In the illustrated embodiment, the duty cycle control means 100 is provided by a processor 98 and a pair of digital-to-analog converters (D/As) 96, 97. The processor 98 may output a digital word to each D/A 96, 97, and, in turn, the D/As output signals $S_1$, $S_2$ to the respective current setting inputs of the current sources 90, 91. Accordingly, the duty cycle of the oscillator 30' may be readily and precisely controlled. Of course, those of skill in the art will appreciate alternative arrangements for setting the duty cycle by controlling the currents $I_1$, $I_2$. For example, one of the currents may be fixed by conventional circuit elements, while the other current is varied or controlled to achieve the desired duty cycle.

Another aspect of the oscillator 30' is the ability to turn the current sources 90, 91 on and off as needed. In the illustrated embodiment, a first enable signal $En_1$ is fed back to the charging current source 90 so that the source only operates when connected to the capacitor 58' by the switch 93. Similarly, a second enable signal $En_2$ is generated by the first illustrated inverter 101 and fed back to the second or discharging current source. A second inverter 102 is provided in the illustrated embodiment to further buffer the output as would be readily appreciated by those skilled in the art. In addition, either the $En_1$ or $En_2$ may be used to synchronize or control the switch 93 as would also be readily understood by those skilled in the art.

As in the first embodiment described above with reference to FIGS. 1–5, the precision oscillator 30' also advantageously provides an output independent of the supply voltage $V_{dd}$ and using only a single capacitor 58'. The precision oscillator 30' also advantageously uses a hysteretic comparator 95 or Schmitt trigger, and provides duty cycle control means 100 for readily controlling the duty cycle of the oscillator.

Turning now more particularly to FIG. 7, the setting of the duty cycle is further explained. As would be readily understood by those skilled in the art, the charging time of the capacitor 58' is given by $CV/I_1$, where C is the capacitance, and V is the hysteretic band, such as 2 volts, for example. Similarly, the discharge time is given by $CV/I_2$. Thus, the total time for a cycle (T) is given by the sum of charging and discharging times, and the output $V_o$ is high while the capacitor is being charged by the charging current $I_1$ and this defines the on time (t) The duty cycle is given by t/T. In the embodiment illustrated in FIG. 7, the charging current $I_1$ is twice the discharging current $I_2$, and the duty cycle (t/T) is therefore 33 percent. Those of skill in the art will recognize that other duty cycles may be readily and accurately determined. In addition, those of skill in the art will recognize that the hysteresis band V, and the capacitance C also affect the charging and discharging times.

The embodiment of the precision oscillator 30' described above may be used in applications requiring an oscillating or clocking signal. For example, the precision oscillator 30' may be used in the speedometer system 80 as shown in FIG. 5 and as described above. Those of skill in the art will appreciate many other similar application. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An electronic circuit for a speedometer system comprising:
   a wheel sensor producing an output signal;
   an air core gauge motor operating in response to an input signal;
   an analog voltage converter for coupling between said wheel sensor and said air core gauge motor, said analog voltage converter using an oscillating signal for determining a speed responsive to the output signal from said wheel sensor for providing the input signal to said air core gauge motor; and
   an oscillator for generating the oscillating signal comprising
      a capacitor,
      a charging current source having a current setting input for permitting setting of a charging current to said capacitor,
      a discharging current source having a current setting input for permitting setting of a discharging current from said capacitor,
      switch means for alternatingly connecting said capacitor to said charging current source and said discharging current source to thereby alternatingly charge and discharge said capacitor,
      a hysteretic comparator connected to said capacitor for producing an oscillating signal responsive to alternatingly charging and discharging said capacitor, and
      duty cycle control means connected to at least one of said charging current source and said discharging current source for setting at least one of the charging current and the discharging current to thereby set a duty cycle of the oscillating signal, said duty cycle control means comprising
         a processor, and
         respective first and second digital-to-analog converters connected between said processor and said charging current source and said discharging current source.

2. An electronic circuit according to claim 1, wherein said duty cycle control means comprises means for setting a ratio of the charging current and the discharging current to thereby set the duty cycle of the oscillating signal.

3. An electronic circuit according to claim 1, wherein said hysteretic comparator has a predetermined hysteretic band, and said capacitor has a predetermined capacitance.

4. An electronic circuit according to claim 1, further comprising switch control means for operating said switch means based upon the oscillating signal from said hysteretic comparator.

5. An electronic circuit according to claim 1, wherein said charging current source has an enable input for enabling operation thereof; wherein said discharging current source has an enable input for enabling operation thereof; and wherein said switch control means further comprises enabling means connected to the respective enable inputs of said charging current source and discharging current source for alternatingly enabling same.

6. An electronic circuit according to claim 1, wherein said charging current source is connected to a first supply voltage; wherein said capacitor is connected to a second supply voltage so that said charging current source is connectable in series with said capacitor between the first and second supply voltages.

7. An electronic circuit according to claim 6, wherein said discharging current source is connected to the second supply voltage so that said discharging current source is connectable in parallel with said capacitor.

8. An electronic circuit for a speedometer system comprising:
   a wheel sensor producing an output signal;
   an air core gauge motor operating in response to an input signal;
   an analog voltage converter for coupling between said wheel sensor and said air core gauge motor, said analog voltage converter using an oscillating signal for determining a speed responsive to the output signal from said wheel sensor for providing the input signal to said air core gauge motor; and
   an oscillator for generating the oscillating signal comprising
      a capacitor connected to a second supply voltage,
      a charging current source having a current setting input for permitting setting of a charging current to said capacitor, said charging current source being connected to a first supply voltage so that said charging current source is connectable in series with said capacitor between the first and second supply voltages,
      a discharging current source having a current setting input for permitting setting of a discharging current from said capacitor, said discharging current source being connected to the second supply voltage so that said discharging current source is connectable in parallel with said capacitor,
      switch means for alternatingly connecting said capacitor to said charging current source and said discharging current source to thereby alternatingly charge and discharge said capacitor,
      a hysteretic comparator connected to said capacitor for producing an oscillating signal responsive to alternatingly charging and discharging said capacitor, and
      duty cycle control means connected to at least one of said charging current source and said discharging current source for setting at least one of the charging current and the discharging current to thereby set a duty cycle of the oscillating signal, said duty cycle control means comprising a processor, and respective first and second digital-to-analog converters connected between said processor and said charging current source and said discharging current source.

9. An electronic circuit according to claim 8, wherein said duty cycle control means comprises means for setting a ratio of the charging current and the discharging current to thereby set the duty cycle of the oscillating signal.

10. An electronic circuit according to claim 8, further comprising switch control means for operating said switch means based upon the oscillating signal from said hysteretic comparator.

11. An electronic circuit according to claim 8, wherein said charging current source has an enable input for enabling operation thereof; wherein said discharging current source has an enable input for enabling operation thereof; and wherein said switch control means further comprises enabling means connected to the respective enable inputs of said charging current source and discharging current source for alternatingly enabling same.

12. A method for operating a speedometer system of a type including a wheel sensor, an air core gauge motor, and an analog voltage converter connected between the wheel sensor and the air core gauge motor, the method comprising the steps of:

producing an output signal responsive to the wheel sensor;

generating an oscillating signal for coupling to the analog voltage converter by alternatingly connecting a capacitor to a charging current source and a discharging current source to thereby alternatingly charge and discharge the capacitor;

hysteretically comparing a capacitor voltage to a reference voltage for producing the oscillating signal responsive to alternatingly charging and discharging the capacitor;

setting a charging current and a discharging current based upon an output of a processor to respective first and second digital-to-analog converters connected between the processor and the charging current source and the discharging current source to thereby set a duty cycle of the oscillating signal; and using the oscillating signal for determining a speed responsive to the output signal from the wheel sensor for providing an input signal to the air core gauge motor.

13. A method according to claim 12, further comprising the step of driving a speedometer display using the air core gauge motor.

14. A method according to claim 12, further comprising the step of setting at least one of the charging current and the discharging current to thereby set a duty cycle of the oscillating signal.

15. A method according to claim 12, wherein the step of alternatingly connecting comprises alternating connecting the capacitor to the charging current source and the discharging current source based upon the oscillating signal.

16. A method according to claim 12, wherein the charging current source has an enable input for enabling operation thereof, and wherein the discharging current source has an enable input for enabling operation thereof; and further comprising the step of alternatingly enabling the charging current source and discharging current source based upon the oscillating signal.

\* \* \* \* \*